United States Patent
Sudo

(10) Patent No.: US 8,154,050 B2
(45) Date of Patent: Apr. 10, 2012

(54) SEMICONDUCTOR DEVICE WITH SEMICONDUCTOR EPITAXIAL LAYERS BURIED IN SOURCE/DRAIN REGIONS, AND FABRICATION METHOD OF THE SAME

(75) Inventor: Gaku Sudo, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 249 days.

(21) Appl. No.: 12/187,567

(22) Filed: Aug. 7, 2008

(65) Prior Publication Data

US 2009/0039399 A1 Feb. 12, 2009

(30) Foreign Application Priority Data

Aug. 8, 2007 (JP) .................................. 2007-206951

(51) Int. Cl.
*H01L 29/78* (2006.01)
*H01L 21/20* (2006.01)
*H01L 21/363* (2006.01)

(52) U.S. Cl. ........... 257/190; 257/E21.092; 257/E21.09; 257/E21.097; 257/E21.562; 257/E21.385; 438/41; 438/44; 438/269; 438/300; 438/360; 438/429

(58) Field of Classification Search .................. 257/190, 257/E21.092
See application file for complete search history.

(56) References Cited

U.S. PATENT DOCUMENTS

| | | | | |
|---|---|---|---|---|
| 5,937,300 | A * | 8/1999 | Sekine et al. .................. | 438/300 |
| 6,323,525 | B1 * | 11/2001 | Noguchi et al. .............. | 257/385 |
| 6,657,223 | B1 * | 12/2003 | Wang et al. ................... | 257/19 |
| 7,105,393 | B2 * | 9/2006 | Yao et al. ....................... | 438/167 |
| 7,494,884 | B2 * | 2/2009 | Lin et al. ........................ | 438/300 |
| 2005/0062108 | A1 * | 3/2005 | Nagai ............................ | 257/388 |
| 2007/0210301 | A1 * | 9/2007 | Han ............................... | 257/18 |
| 2008/0128748 | A1 * | 6/2008 | Iinuma ........................... | 257/190 |
| 2008/0179629 | A1 * | 7/2008 | Yasutake ....................... | 257/190 |
| 2008/0246057 | A1 * | 10/2008 | Lin et al. ........................ | 257/190 |
| 2009/0095992 | A1 * | 4/2009 | Sanuki et al. ................. | 257/288 |

FOREIGN PATENT DOCUMENTS

JP 8-167717 6/1996

(Continued)

OTHER PUBLICATIONS

Ghani, et al., "A 90nm High Volume Manufacturing Logic Technology Featuring Novel 45nm Gate Length Strained Silicon CMOS Transistors", IEDM 2003, pp. 1-3, (Dec. 7, 2003).
Ang, et al., "50 nm Silicon-On-Insulator N-MOSFET Featuring Multiple Stressors: Silicon-Carbon Source/Drain Regions and Tensile Stress Silicon Nitride Liner", 2006 IEEE, 2006 Symposium on VLSI Technology Digest of Technical Papers, pp. 1-2, (Jun. 13, 2006).

(Continued)

*Primary Examiner* — Fernando L Toledo
*Assistant Examiner* — John P Dulka
(74) *Attorney, Agent, or Firm* — Finnegan, Henderson, Farabow, Garrett & Dunner, L.L.P.

(57) ABSTRACT

A semiconductor device in which semiconductor epitaxial layers are embedded in the source/drain regions includes an element formation region formed in the major surface of a semiconductor substrate, a gate electrode formed on a part of the element formation region, the semiconductor epitaxial layers formed in the source/drain regions of the element formation region so as to sandwich the channel region below the gate electrode, and silicide layers formed on the gate electrode and semiconductor epitaxial layers. Each semiconductor epitaxial layer has a three-layered structure in which first semiconductor films different in material or composition from the semiconductor substrate sandwich a second semiconductor film having a silicidation reactivity higher than that of the first semiconductor films. Each silicide layer extends to the second semiconductor film along the interface between the semiconductor substrate and semiconductor epitaxial layer.

6 Claims, 9 Drawing Sheets

FOREIGN PATENT DOCUMENTS

| | | |
|---|---|---|
| JP | 11-97674 | 4/1999 |
| JP | 2001-53027 | 2/2001 |
| JP | 2005-101278 | 4/2005 |
| JP | 2005-340816 | 12/2005 |
| JP | 2007-501526 | 1/2007 |
| JP | 2007-165665 | 6/2007 |
| JP | 2008-177319 | 7/2008 |
| JP | 2008-192989 | 8/2008 |

OTHER PUBLICATIONS

Yang, et al., "Dual Stress Liner for High Performance sub-45nm Gate Length SOI CMOS Manufacturing", IEDM 2004, 2004 IEEE, pp. 1-3, (Dec. 13, 2004).

Office Action issued by the Japanese Patent Office on Jan. 26, 2010, for Japanese Patent Application No. 2007-206951 and English-language translation.

* cited by examiner

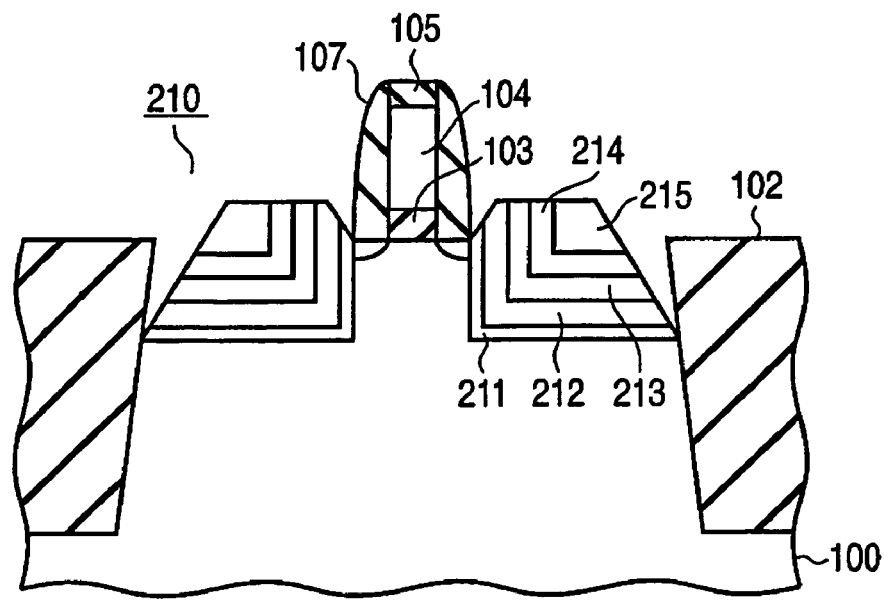
F I G. 4
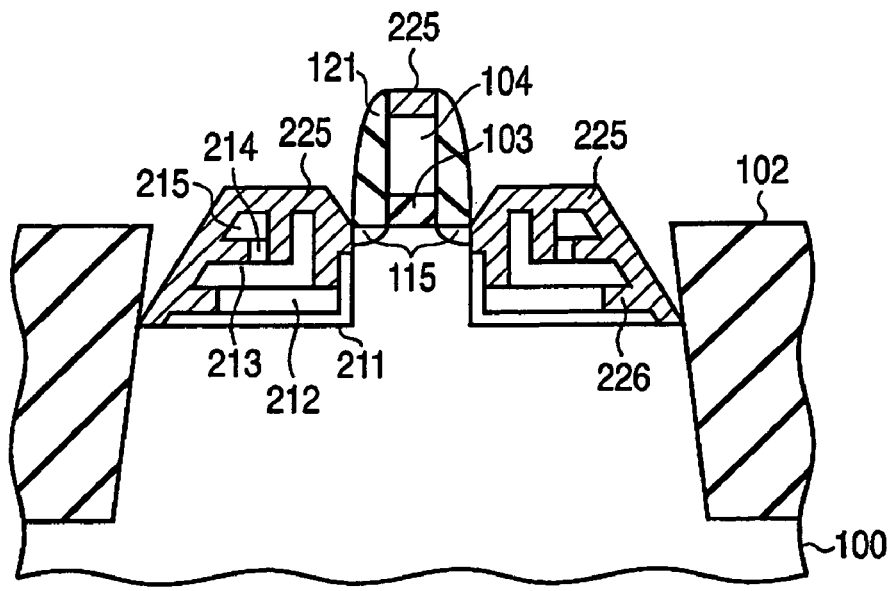
F I G. 5

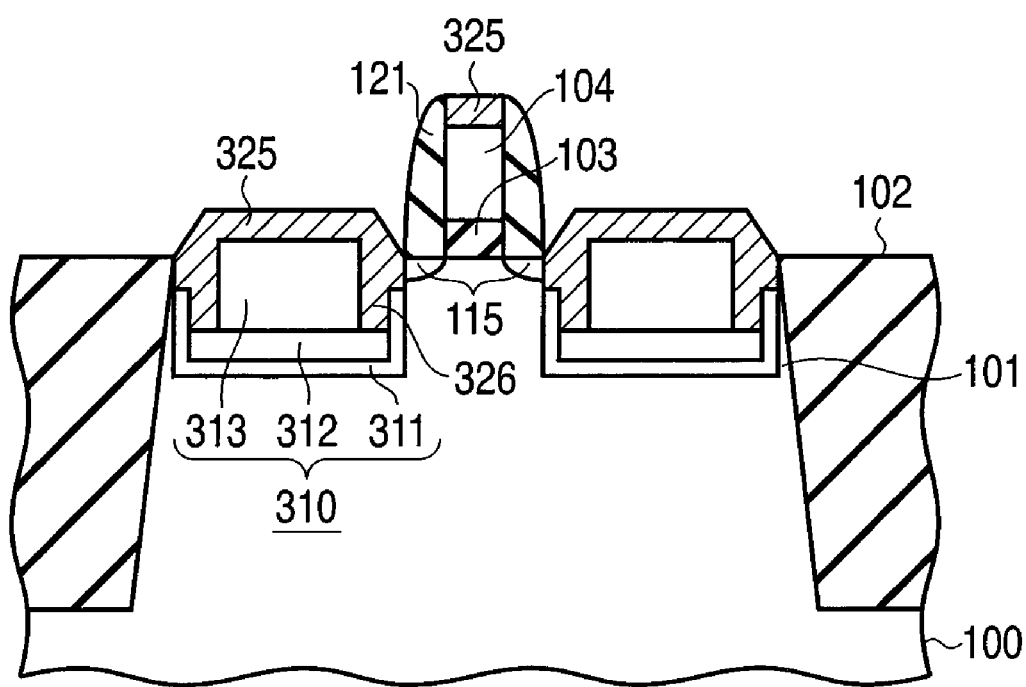
F I G. 6

SEMICONDUCTOR DEVICE WITH SEMICONDUCTOR EPITAXIAL LAYERS BURIED IN SOURCE/DRAIN REGIONS, AND FABRICATION METHOD OF THE SAME

CROSS-REFERENCE TO RELATED APPLICATIONS

This application is based upon and claims the benefit of priority from prior Japanese Patent Application No. 2007-206951, filed Aug. 8, 2007, the entire contents of which are incorporated herein by reference.

BACKGROUND OF THE INVENTION

1. Field of the Invention

The present invention relates to a semiconductor device in which semiconductor epitaxial layers are embedded in the source/drain regions in order to apply a stress to the channel region, and silicide layers are formed on the epitaxial layers, and a method of fabricating the semiconductor device.

2. Description of the Related Art

From the 90-nm generation of semiconductor process nodes, techniques that improve the transistor performance by applying a stress to the channel region have been used. Examples are a technique that improves the performance of an nMOSFET by using a stress liner, a DSL (Dual Stress Liner) technique using optimum stress liners for both n and p, and an eSiGe (embedded SiGe) technique by which SiGe is embedded in the source/drain regions.

The eSiGe technique can apply a compression stress on an Si channel by embedding SiGe layers in the source/drain regions sandwiching the Si channel, thereby increasing the mobility. In addition, the resistance of the source/drain can be decreased by forming silicide layers on the SiGe layers.

Unfortunately, the eSiGe technique of this kind has the following problem. That is, a silicide to be formed on the SiGe layer is formed by siliciding the SiGe layer. In this silicidation, a silicide abnormally grows toward substrate Si having a silicidation reactivity higher than that of SiGe. This abnormal growth of the silicide to substrate Si increases the junction leakage.

BRIEF SUMMARY OF THE INVENTION

According to an aspect of the present invention, there is provided a semiconductor device including:

an element formation region formed in a major surface of a semiconductor substrate, the element formation region being surrounded by an element isolation region;

a gate electrode formed on a gate insulating film on a part of the element formation region;

semiconductor epitaxial layers formed in source/drain regions of the element formation region to sandwich a channel region below the gate electrode, each semiconductor epitaxial layer having a three-layered structure in which first semiconductor films different in material or composition from the semiconductor substrate sandwich a second semiconductor film having a silicidation reactivity higher than that of the first semiconductor films; and silicide layers formed on the gate electrode and the semiconductor epitaxial layers, each silicide layer extending to the second semiconductor film along an interface between the semiconductor substrate and the semiconductor epitaxial layer.

According to another aspect of the present invention, there is provided a semiconductor device fabrication method including:

forming an element isolation region in a major surface of a semiconductor substrate to surround an element formation region;

forming a gate electrode on a gate insulating film on a part of the element formation region;

forming a trench by selectively etching the element formation region by using the gate electrode as a mask;

forming a semiconductor epitaxial layer in the trench by sequentially growing a first semiconductor film different in material or composition from the substrate, a second semiconductor film having a silicidation reactivity higher than that of the first semiconductor film, and a third semiconductor film made of the same material as that of the first semiconductor film;

forming a first silicide layer on the gate electrode and the semiconductor epitaxial layer, and a second silicide layer extending to the second semiconductor film along an interface between the substrate and the semiconductor epitaxial layer.

BRIEF DESCRIPTION OF THE SEVERAL VIEWS OF THE DRAWINGS

FIG. 4 is a sectional view for explaining a semiconductor device according to the second embodiment during fabrication;

FIG. 5 is a sectional view for explaining the semiconductor device according to the second embodiment at the end of fabrication;

FIG. 6 is a sectional view showing an outline of the arrangement of a semiconductor device according to the third embodiment;

DETAILED DESCRIPTION OF THE INVENTION

Embodiments of the present invention will be explained in detail below with reference to the accompanying drawing.

First Embodiment

Figure 1:
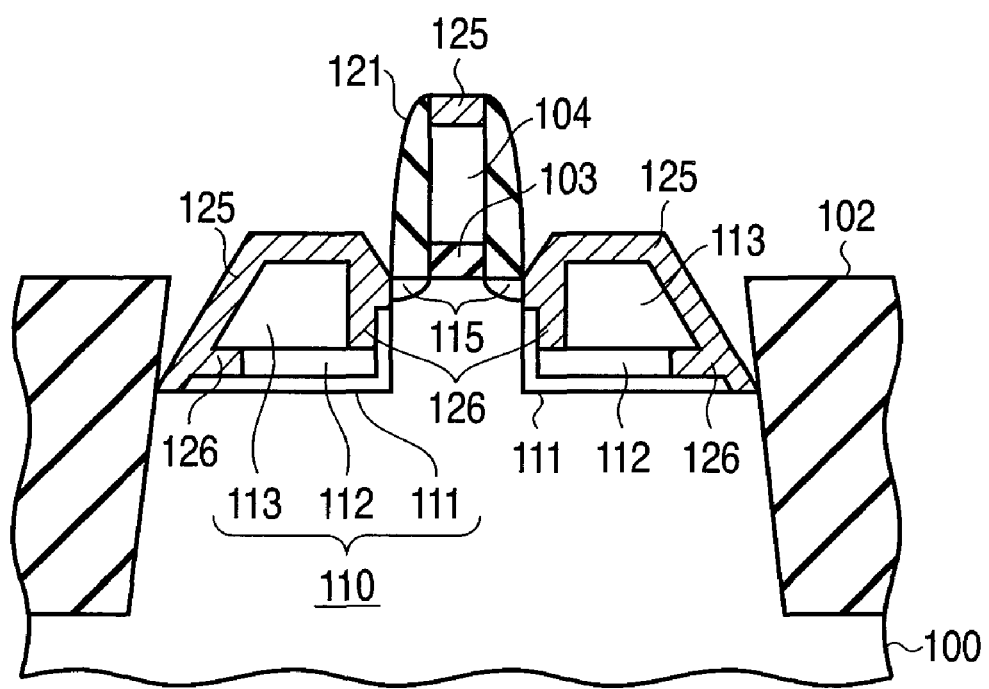
FIG. 1 is a sectional view showing an outline of the arrangement of a semiconductor device according to the first embodiment.

FIG. 1 is a sectional view showing an outline of the arrangement of a MOS semiconductor device according to the first embodiment of the present invention. This semiconductor device applies a compression stress to the channel region of a p-channel MOSFET by embedding SiGe in the source/drain regions, thereby improving the driving force of the element.

In FIG. 1, reference numeral 100 denotes an n-type Si substrate. An element isolation region 102 made of a silicon oxide film is formed in the major surface of the Si substrate 100 so as to surround an element formation region. On the element formation region of the Si substrate 100, a gate electrode 104 made of poly-Si is formed on a gate insulating film 103 made of a silicon oxide film. Sidewall insulating films 121 made of silicon nitride films are formed on the side portions of the gate electrode 104.

Trenches are formed by etching in the source/drain regions sandwiching a gate portion including the gate electrode 104 and gate sidewall insulating films 121. Semiconductor epitaxial layers 110 functioning as p-type source/drain regions are formed in these trenches. The semiconductor epitaxial layers 110 are each formed by sequentially stacking and growing an SiGe layer (first semiconductor film) 111, Si layer (second semiconductor film) 112, and SiGe layer (third semiconductor film) 113. Also, p-type diffusion layers (source/drain extension regions) 115 are formed between the semiconductor epitaxial layers 110 and channel region.

Ni silicide layers (first silicide layers) 125 are formed on the semiconductor epitaxial layers 110 and the surface portion of the gate electrode 104. In each semiconductor epitaxial layer 110, a silicide layer (second silicide layer) 126 is formed along the interface between the Si substrate 100 and semiconductor epitaxial layer 110 so as to extend from the silicide layer 125 to the Si layer 112.

A method of fabricating the semiconductor device of this embodiment will be explained below with reference to FIGS. 2A to 2F.

Figure 2A:
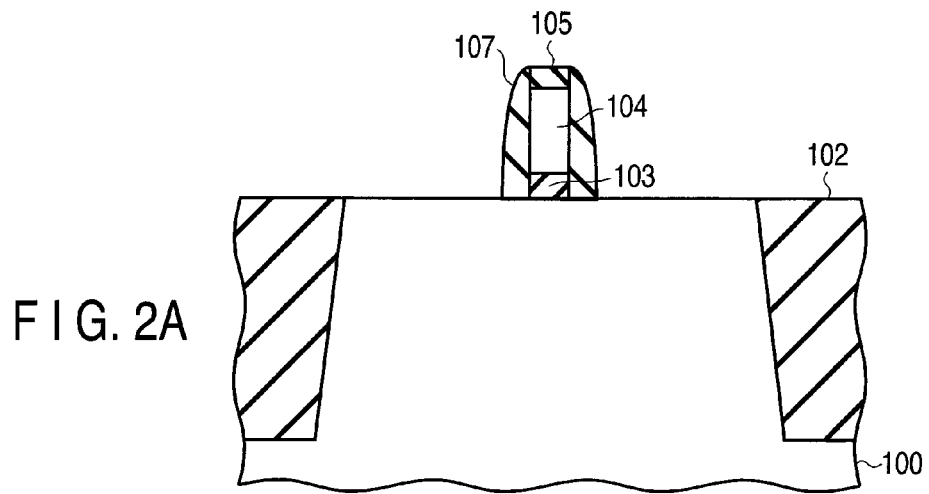
FIGS. 2A to 2F are sectional views showing fabrication steps of the semiconductor device of the first embodiment.

First, as shown in FIG. 2A, an element isolation region 102 made of a silicon oxide film is formed on an n-type Si substrate 100 so as to surround an element formation region. Subsequently, a silicon oxide film (gate insulating film) 103, polysilicon film (gate electrode) 104, and cap layer 105 are formed on the Si substrate 100, and processed into a gate pattern by well-known lithography. After that, sidewall insulating films 107 made of silicon nitride films are formed on the side surfaces of the gate electrode 104. A practical formation method of the sidewall insulating films 107 is to deposit a silicon nitride film on the entire surface and etch back the silicon nitride film, thereby leaving silicon nitride films on only the side surfaces of the gate electrode 104.

Figure 2B:
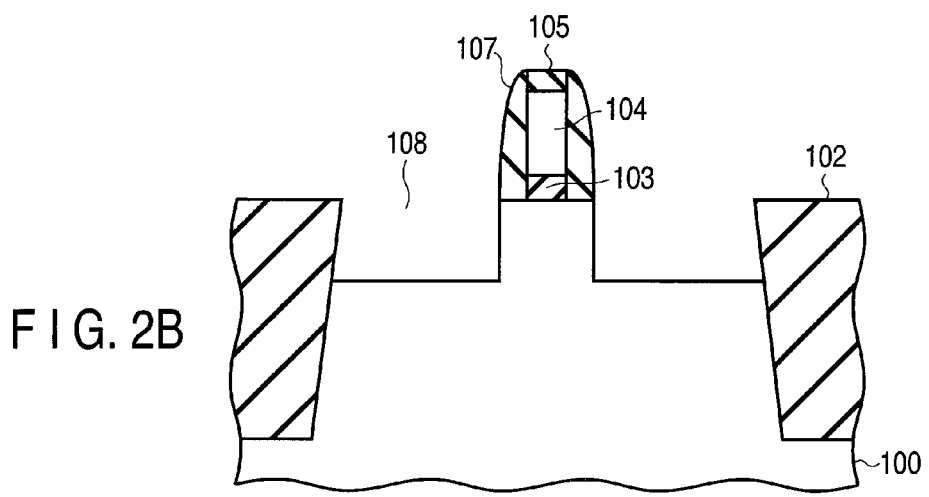

Then, as shown in FIG. 2B, the Si substrate 100 is selectively etched by using the cap layer 105 and sidewall insulating films 107 as masks, thereby forming trenches 108 for forming source/drain regions.

Figure 2C:
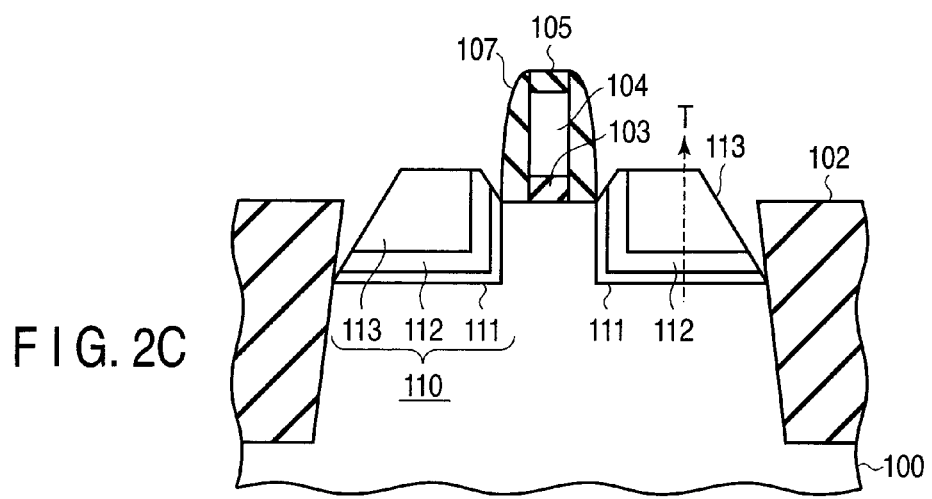

As shown in FIG. 2C, SiGe/Si/SiGe semiconductor epitaxial layers 110 are formed by epitaxial growth. More specifically, after SiGe layers 111 having a Ge concentration of 20 atm % are grown by CVD, Si layers 112 are grown by changing the gas species, and SiGe layers 113 having the same composition as that of the SiGe layers 111 are grown by returning the gas species to the original one. In this case, the semiconductor epitaxial layers 110 can be selectively grown on only the exposed portions of substrate Si.

Figure 3:
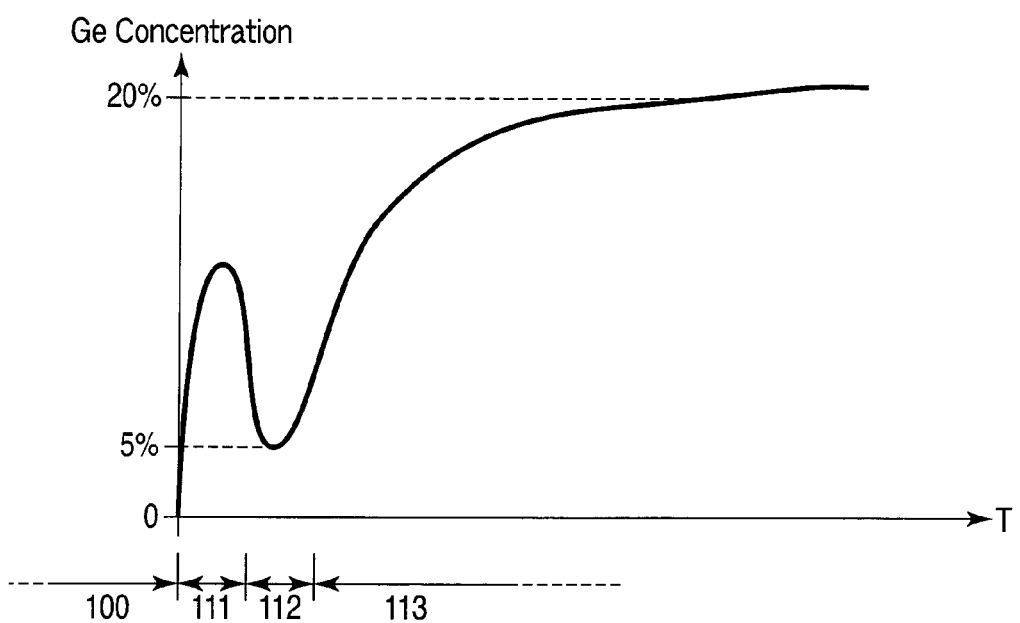
FIG. 3 is a graph showing the Ge concentration distribution in a semiconductor epitaxial layer in the thickness direction.

In the structure shown in FIG. 2C, the Ge concentration in each epitaxial layer 110 in a direction (T direction) perpendicular to the substrate surface is as shown in FIG. 3. That is, since the Si layer 112 exists, Ge in the SiGe layers 111 and 113 diffuses in the Si layer 112, so the Ge concentration decreases in those portions of the SiGe layers 111 and 113 which are close to the Si layer 112. Consequently, the Ge concentration was about 5% near the central portion of the Si layer 112, and about 20% in that portion of the SiGe layer 113 which was apart from the Si layer 112.

Figure 2D:
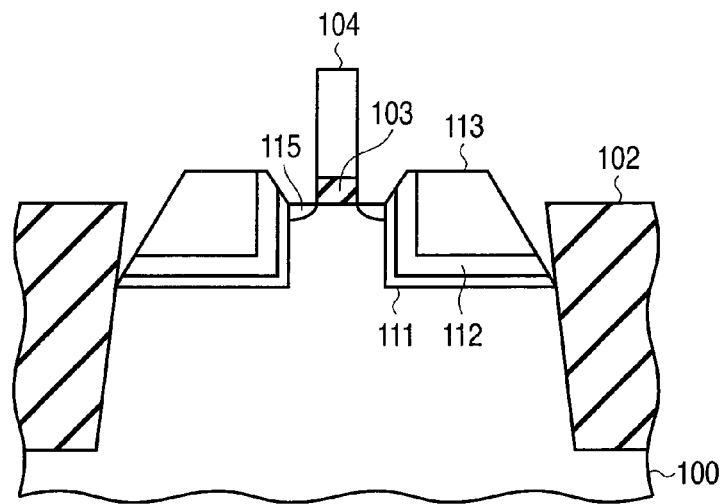

As shown in FIG. 2D, the cap layer 105 and sidewall insulating films 107 are removed. After that, the gate electrode 104 is used as a mask to ion-implant an impurity such as boron into the surface portion of the Si substrate 100, thereby forming p-type diffusion layers (source/drain extension regions) 115.

Figure 2E:
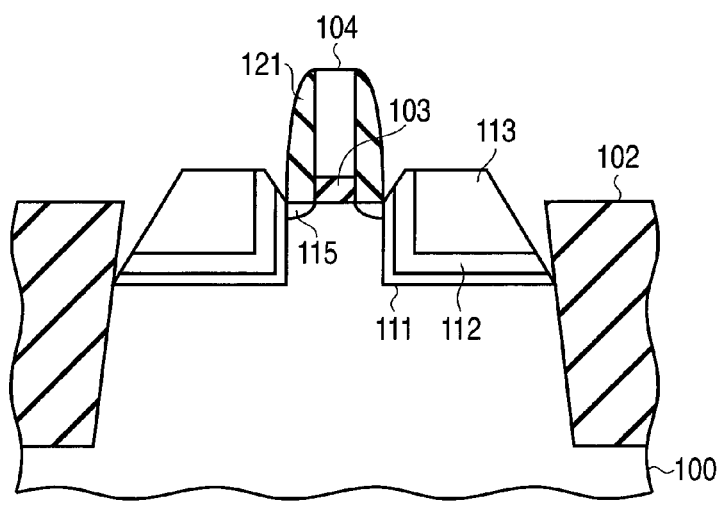
Figure 2F:
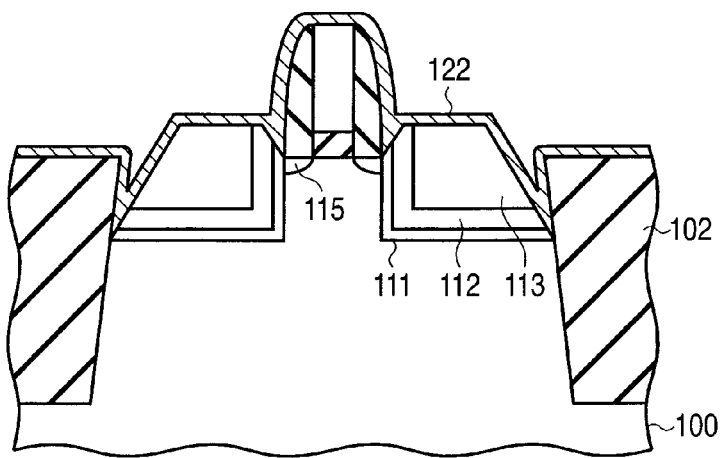

As shown in FIG. 2E, sidewall insulating films 121 made of silicon nitride films are formed again. Subsequently, an Ni film 122 is deposited on the entire surface as shown in FIG. 2F.

Then, annealing is performed to silicide the semiconductor regions in contact with the Ni film 122, thereby forming Ni silicide films 125. The structure shown in FIG. 1 is obtained by removing unsilicided Ni films 122.

In this silicidation, Si is silicided more easily than SiGe. In each Si layer 112, therefore, a silicide layer 126 extends along the interface between the epitaxial layer 110 and Si substrate 100. Since silicidation of the Si layer 112 consumes Ni, the silicide does not extend to the Si substrate 100.

Figure 10:
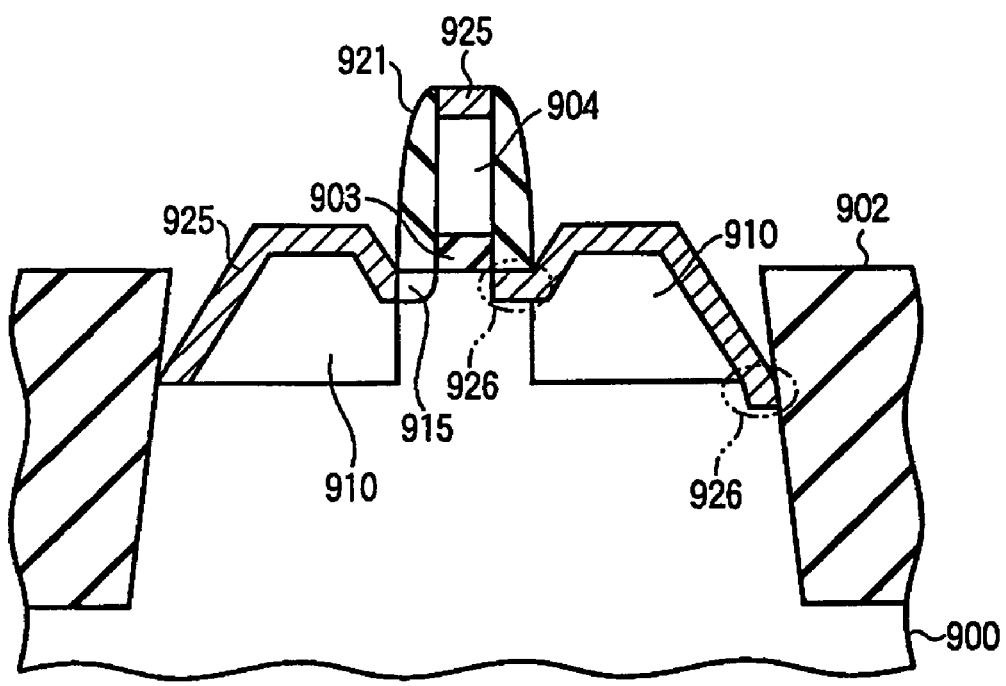
FIG. 10 is a sectional view showing a general element structure using the eSiGe technique.

For comparison, FIG. 10 shows an element structure obtained by the general eSiGe technique. In FIG. 10, reference numeral 900 denotes an n-type Si substrate; 902, an element isolation region; 903, a gate insulating film; 904, a gate electrode; 910, semiconductor epitaxial layers made of SiGe; 915, source/drain extension regions; 921, sidewall insulating films; and 925, silicide layers.

When forming the silicide layers 925 in the structure shown in FIG. 10, the silicide abnormally grows (926) toward substrate Si having a silicidation reactivity higher than that of the SiGe layer 910. By contrast, this embodiment can suppress this abnormal growth of the silicide to substrate Si by adopting the three-layered structure of SiGe/Si/SiGe as the semiconductor epitaxial layer 110. That is, Ni can be consumed by silicidation of the Si layer 112 in the semiconductor epitaxial layer 110. This makes it possible to suppress extension of the silicide toward the Si substrate 100.

In this embodiment as described above, when forming eSiGe by epitaxial growth, SiGe having a low silicidation reactivity, Si having a high silicidation reactivity, and SiGe having a low silicidation reactivity are stacked like SiGe/Si/SiGe. Since silicidation is performed after this SiGe/Ge/SiGe stack is formed, Ni positively diffuses into the Si layer 112 having a high silicidation reactivity. That is, abnormal growth of the silicide to substrate Si can be suppressed by guiding Ni to a highly reactive layer by using the difference in silicidation reactivity of Ni. This makes it possible to reduce the junction leakage. It is also possible to further apply a compression stress to the Si channel region by the volume expansion of the silicide having diffused into the Si layer 112. Consequently, the mobility of the p-channel MOSFET can be further increased.

Second Embodiment

FIGS. 4 and 5 are views showing an outline of the arrangement of a semiconductor device according to the second embodiment of the present invention. FIG. 4 is a sectional view during fabrication. FIG. 5 is a sectional view at the end of fabrication. Note that the same reference numerals as in FIGS. 1 and 2 denote the same parts in FIGS. 4 and 5, and a repetitive explanation will be omitted.

This embodiment differs from the first embodiment described above in that the number of layers in a semiconductor epitaxial layer is increased. A semiconductor epitaxial layer 210 of this embodiment is formed by sequentially stacking and growing an SiGe layer (first semiconductor film) 211, Si layer (second semiconductor film) 212, SiGe layer (third semiconductor film) 213, Si layer (fourth semiconductor film) 214, and SiGe layer (fifth semiconductor film) 215. That is, an SiGe/Si/SiGe/Si/SiGe stack is formed in the formation of eSiGe. The Ge concentration in the SiGe layers 211, 213, and 215 is about 20% as in the SiGe layers 111 and 113. Reference number 225 denotes a first silicide layer, and reference number 226 denotes a second silicide layer.

In this arrangement, when siliciding the semiconductor epitaxial layer 210, abnormal growth of the silicide to substrate Si can be suppressed by guiding Ni to the highly reactive Si layers 212 and 214. Accordingly, the same effect as in the first embodiment can be obtained. In addition, the silicide extends not only to the Si layer 212 but also to the Si layer 214. This further increases the effect of increasing a compression stress to the Si channel resulting from volume expansion.

Third Embodiment

FIG. 6 is a sectional view showing an outline of the arrangement of a semiconductor device according to the third embodiment of the present invention. Note that the same reference numerals as in FIGS. 1 and 2 denote the same parts in FIG. 6, and a repetitive explanation will be omitted.

This embodiment differs from the first embodiment in that when recessing an element region before epitaxial growth, highly anisotropic etching is performed to leave substrate Si regions in contact with an element isolation region 102 behind on the side portions of trenches in the source/drain regions.

In the arrangement of this embodiment, epitaxial layers 310 are formed to the substrate surface in the trenches not only on the sides of the channel region but also on the sides of the element isolation region 102. This makes it possible to suppress the extension of a silicide to an Si substrate 100 in the interface between the Si substrate 100 and element isolation region 102. Even if the silicide extends to the Si substrate 100, no leak occurs due to this extension of the silicide to the Si substrate 100. This is so because the uppermost portion of the Si substrate 100 is positioned above the bottom portions of the epitaxial layers 310 as the source/drain regions in the interfaces with the element isolation region 102.

Figure 7A:
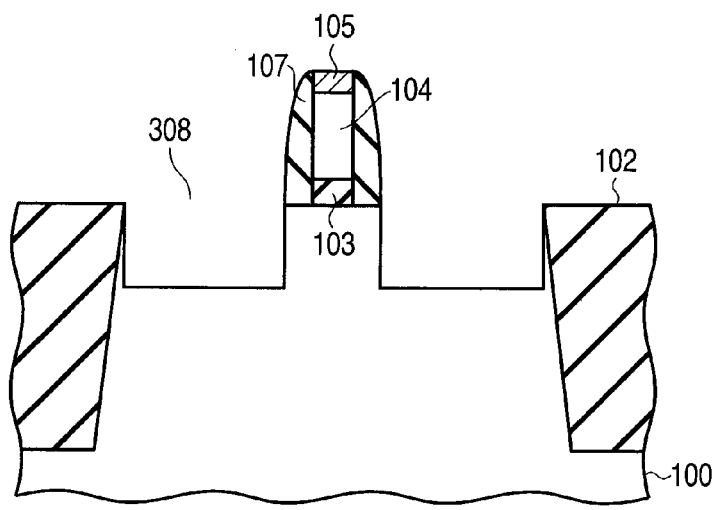
FIGS. 7A to 7C are sectional views showing fabrication steps of the semiconductor device of the third embodiment.
Figure 7B:
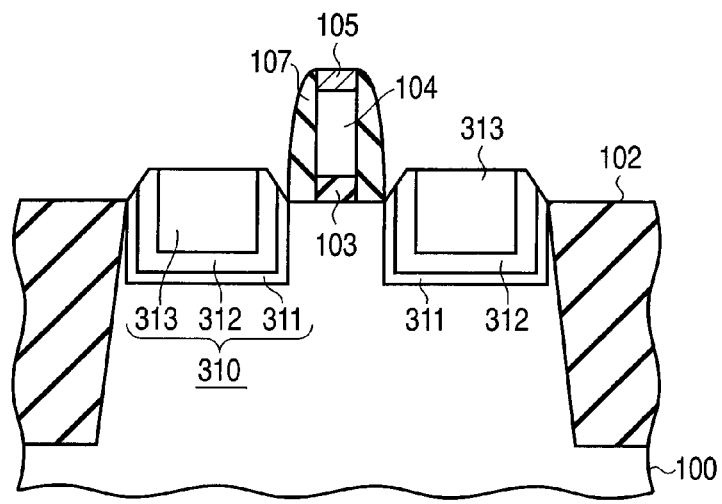
Figure 7C:
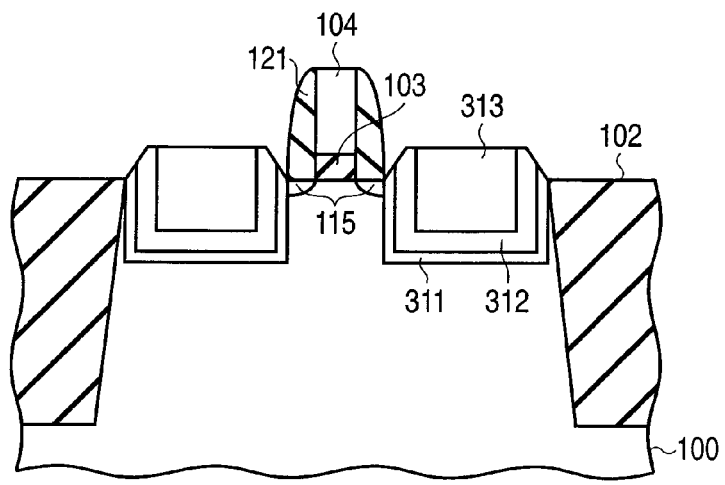

FIGS. 7A to 7C are sectional views showing fabrication steps of the semiconductor device of this embodiment shown in FIG. 6.

The fabrication steps are basically the same as those of the first embodiment except for the step of forming trenches in the source/drain regions.

In the same manner as in FIG. 2A, a gate portion including a gate insulating film 103, polysilicon film (gate electrode) 104, and cap layer 105 is formed on an element formation region of an Si substrate 100, and sidewall insulating films 107 are formed on the side surfaces of the gate portion.

Then, as shown in FIG. 7A, the cap layer 105 and sidewall insulating films 107 are used as masks to vertically etch the Si substrate 100 by RIE, thereby forming trenches 308 for forming the source/drain regions. In this step, thin walls of substrate Si remain on the sides of an element isolation region 102. The thin walls of substrate Si thus remain when the Si substrate 100 is vertically etched because the side surfaces of the element isolation region 102 are not perpendicular but slightly inclined to the Si substrate 100.

After that, as shown in FIG. 7B, SiGe/Si/SiGe epitaxial layers 310 are formed in the same manner as in the first embodiment described previously. More specifically, after SiGe layers 311 having a Ge concentration of 20 atm % are formed by CVD, Si layers 312 are grown by changing the gas species, and SiGe layers 313 having the same composition as that of the SiGe layers 311 are grown by returning the gas species to the original one. Note that before growing the epitaxial layers 310, an impurity such as boron may also be ion-implanted into the surface portion of the substrate 100 by using the gate portion as a mask.

Subsequently, as shown in FIG. 7C, the cap layer 105 and sidewall insulating films 107 are removed, and sidewall insulating films 121 are formed again, in the same manner as in the first embodiment. Then, an Ni film is formed, and silicide layers 325 and 326 are formed by siliciding the Ni film by annealing, thereby obtaining the structure shown in FIG. 6.

Even this arrangement can of course achieve the same effects as in the first embodiment, and can also further reduce the junction leakage.

Fourth Embodiment

Figure 8:
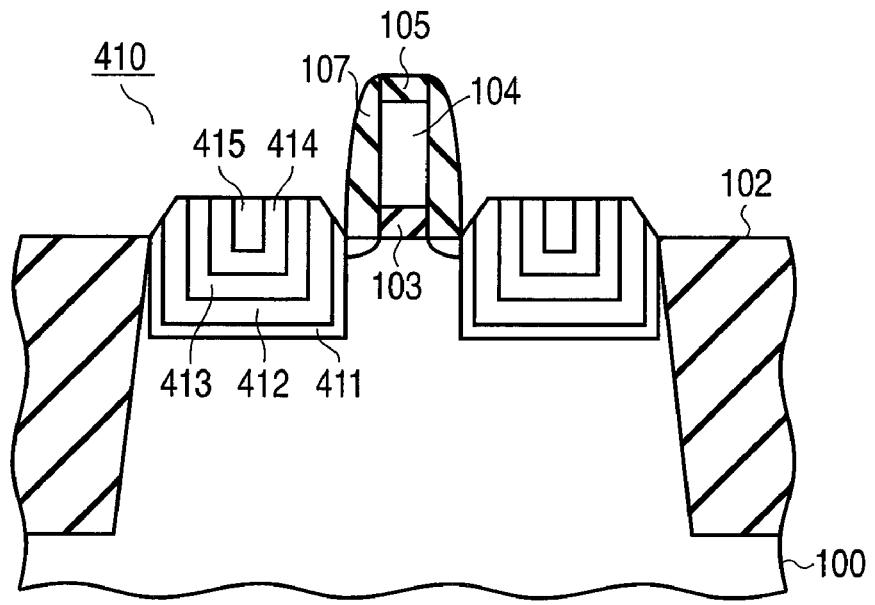
FIG. 8 is a sectional view for explaining a semiconductor device according to the fourth embodiment during fabrication.
Figure 9:
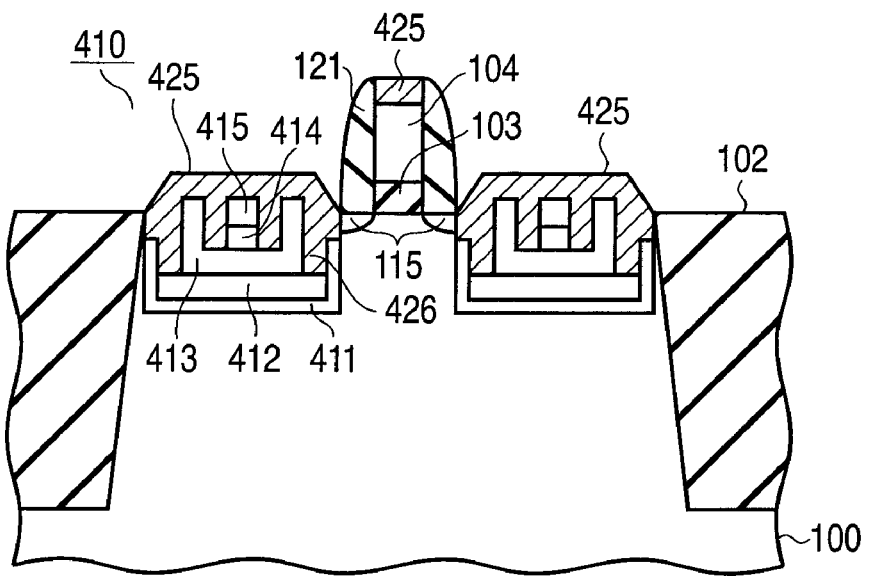
FIG. 9 is a sectional view for explaining the semiconductor device according to the fourth embodiment at the end of fabrication.

FIGS. 8 and 9 are views showing an outline of the arrangement of a semiconductor device according to the fourth embodiment of the present invention. FIG. 8 is a sectional view during fabrication. FIG. 9 is a sectional view at the end of fabrication. Note that the same reference numerals as in FIGS. 1 and 2 denote the same parts in FIGS. 8 and 9, and a repetitive explanation will be omitted.

This embodiment differs from the third embodiment described above in that the number of layers in a semiconductor epitaxial layer is increased. A semiconductor epitaxial layer 410 is formed by sequentially stacking and growing an SiGe layer 411, Si layer 412, SiGe layer 413, Si layer 414, and SiGe layer 415. That is, an SiGe/Si/SiGe/Si/SiGe stack is formed in the formation of eSiGe. The Ge concentration in the SiGe layers 411, 413, and 415 is about 20% as in the SiGe layers 111 and 113. Reference number 425 denotes a first silicide layer, and reference number 426 denotes a second silicide layer.

This arrangement can of course achieve the same effects as in the third embodiment described above, and can also increase the effect of increasing a compression stress to the Si channel resulting from volume expansion.

(Modifications)

Note that the present invention is not limited to the above embodiments. Each embodiment uses Si as a substrate, and uses the structure in which the SiGe layers (first and third semiconductor films) sandwich the Si layer (second semiconductor film) as a semiconductor epitaxial layer. However, an SiGe layer having a Ge concentration lower than that of the first semiconductor film may also be used instead of the second semiconductor film.

Also, when applying the present invention to an n-channel MOSFET, it is necessary to apply not a compression stress but a tensile stress to the Si channel. In this case, a structure in which first semiconductor films made of SiC sandwich a second semiconductor film made of SiC having a C concentration lower than that of the first semiconductor films or Si can be used as semiconductor epitaxial layers.

It is also possible to use a semiconductor material other than Si as a substrate. In this case, a structure in which first semiconductor films made of a material or composition different from that of the substrate sandwich a second semiconductor film having a silicidation reactivity higher than that of the first semiconductor films can be used as semiconductor epitaxial layers embedded in the source/drain regions. Furthermore, the metal for forming a silicide is not limited to Ni, and it is also possible to use Ti, W, or another metal material. In addition, the fabrication method is not limited to the steps shown in FIGS. 2A to 2F and 7A to 7C, and can also be appropriately changed in accordance with the specifications.

What is claimed is:

1. A semiconductor device comprising:
an element formation region formed in a major surface of a semiconductor substrate, the element formation region being surrounded by an element isolation region;
a gate electrode formed on a gate insulating film on a part of the element formation region;
semiconductor epitaxial layers formed in source/drain regions of the element formation region to sandwich a channel region below the gate electrode, each semiconductor epitaxial layer having a three-layered structure in which first semiconductor films different in material or composition from the semiconductor substrate sandwich a second semiconductor film having a silicidation reactivity higher than that of the first semiconductor films;
a first silicide layer formed on the gate electrode and the semiconductor epitaxial layers, the first silicide layer on the semiconductor epitaxial layers extending to and contacting each of the first and second semiconductor films; and
a second silicide layer formed to extend from the first silicide layer to the second semiconductor film along a direction of an interface between the semiconductor substrate and the semiconductor epitaxial layers, so as to apply a compression stress to the channel region below the gate electrode by expansion caused by silicidation of the second semiconductor film.

2. The device according to claim 1, wherein the semiconductor substrate is made of Si.

3. The device according to claim 1, wherein the semiconductor substrate is made of n-type Si, and the semiconductor epitaxial layers are a p-type.

4. The device according to claim 3, wherein the first semiconductor film is made of SiGe, and the second semiconductor film is made of one of Si and SiGe having a Ge concentration lower than that of the first semiconductor film.

5. The device according to claim 3, wherein the semiconductor epitaxial layer is formed by sequentially stacking and growing a first semiconductor film made of SiGe, a second semiconductor film made of one of Si and SiGe having a Ge concentration lower than that of the first semiconductor film, a third semiconductor film made of SiGe, a fourth semiconductor film made of one of Si and SiGe having a Ge concentration lower than that of the first semiconductor film, and a fifth semiconductor film made of SiGe.

6. The device according to claim 1, wherein side surfaces of the element isolation region are not perpendicular but inclined to the surface of the Si substrate, and thin Si walls made of a part of the Si substrate remain on the semiconductor epitaxial layers on the sides of the element isolation region.

* * * * *